United States Patent
Withers et al.

(10) Patent No.: US 7,344,989 B2
(45) Date of Patent: Mar. 18, 2008

(54) CMP WAFER CONTAMINATION REDUCED BY INSITU CLEAN

(75) Inventors: Bradley S. Withers, Folsom, CA (US); Elvis M. Chan, Rocklin, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 27 days.

(21) Appl. No.: 11/207,400

(22) Filed: Aug. 19, 2005

(65) Prior Publication Data

US 2007/0039927 A1 Feb. 22, 2007

(51) Int. Cl.
*H01L 21/302* (2006.01)

(52) U.S. Cl. ............... 438/692; 438/689; 438/202; 451/41; 451/36; 430/311; 430/322

(58) Field of Classification Search ........... 438/689; 451/41; 430/311

See application file for complete search history.

(56) References Cited

U.S. PATENT DOCUMENTS 6,145,148 A 11/2000 Hymes et al. .......... 15/77
6,737,221 B2 * 5/2004 Futase et al. .......... 430/311

OTHER PUBLICATIONS

S. Wolf, Silicon Processing for the VLSI Era, vol. 4, Lattice Press (2002), pp. 377, 381-384.*

Niu, Pao-Kang et al.; "The Process Window Study of Oxide Buffing After WCMP Process";;TSMC; 121, Park Ave. 3; Science-Based Industrial Park Hsin-Chu; Taiwan, R.O.C.; Mar. 7-8, 2001; CMP-MIC Conference; 2001 IMIC—600P/00/0375; pp. 375-378.

Shieh, Alex et al., "Characterization of Oxide Buffing in W-CMP" MACRONIX International Co., LTD., Advanced Module Process Development Division/Silicon Technology Laboratory; No. 16, Li-Hsin Road, Science-Based Industrial Park, Hsinchu, Taiwan, R.O.C.; Mar. 7-8, 2001; CMP-MIC Conference; 2001 IMIC—600P/00/0383; pp. 383-386.

Yan, Y.F.;"Tungsten CMP Process With On-Table Oxide Buff"; Bell Laboratories, Lucent Technologies, Cirent Semiconductor; 9333 S. John Young Pkwy.; Orlando, Florida, 32819; Mar. 7-8, 2001, CMP-MIC Conference, 2001 IMIC—600P/00/0131; pp. 131-135.

* cited by examiner

*Primary Examiner*—Lan Vinh
*Assistant Examiner*—Maki Angadi
(74) *Attorney, Agent, or Firm*—Campbell Stephenson LLP

(57) ABSTRACT

Reducing CMP wafer contamination by in-situ clean is disclosed herein. The invention can be employed in a method in which a conductive layer is formed on a surface of a semiconductor wafer. After a portion of the conductive layer is removed, an acidic solution is directly or indirectly applied to the semiconductor wafer. Then the semiconductor wafer is engaged with a polishing pad as the acidic solution is applied directly or indirectly to the semiconductor wafer. In one embodiment, the portion of the conductive layer is removed by a CMP tool, and the semiconductor wafer is engaged with the polishing pad before the semiconductor is removed from the CMP tool.

13 Claims, 4 Drawing Sheets

CMP WAFER CONTAMINATION REDUCED BY INSITU CLEAN

BACKGROUND OF THE INVENTION

Integrated circuits (ICs) are formed on semiconductor wafers using conventional techniques and tools. A typical IC includes thousand of devices (e.g., logic gates, resisters, etc.) each of which may include many complimentary metal oxide semiconductor (CMOS) transistors coupled together via electrically conductive interconnect lines. The devices themselves may also be connected together via electrically conductive interconnect lines.

Many tools are used during the formation of ICs on semiconductor wafers. One tool used repeatedly during IC formation is the chemical mechanical polisher or CMP. Essentially, CMP's are tools that remove excess metal such as tungsten formed on the surface of a wafer. To illustrate, FIGS. 1A-1C show a cross-sectional view of a semiconductor wafer 10 during formation of tungsten plugs to couple electrically conductive interconnect lines on different levels. More particularly, FIG. 1A shows a first dielectric layer 12 deposited on substrate 11, an electrically conductive interconnect line 14, and a second dielectric layer 16. FIG. 1A also shows vias 20 formed within second dielectric layer 16. Vias 20 may have been formed by depositing a photo-resist layer (not shown) over dielectric layer 16, selectively exposing this photoresist layer to light passing through a patterned reticle having via hole patterns, developing and subsequently removing the light exposed photoresist to form a photoresist via mask pattern. Dielectric layer 16 is then etched through this photoresist via mask pattern to create vias 20. Thereafter, the remaining photoresist via mask formed on dielectric layer 16 is removed using conventional techniques. As shown, vias 20 expose underlining electrically conductive interconnect 14.

After formation of vias 20 within the second dielectric layer 16, a layer of tungsten is deposited using conventional techniques. FIG. 1B shows the wafer 10 of FIG. 1A with a tungsten layer 22 deposited thereon. A portion of this tungsten fills vias 20 and will eventually form tungsten plugs that couple electrically conductive interconnect line 14 with another electrically conductive interconnect line (not shown) on a vertically higher level.

After formation of tungsten layer 22, wafer 10 undergoes CMP polishing to remove excess tungsten and form tungsten plugs. FIG. 2 illustrates relevant components of a conventional CMP 24 that can be used for removing excess tungsten from the surface of a wafer, such as wafer 10 of FIG. 1B. The CMP 24 shown in FIG. 2 includes a spindle 26 coupled to a wafer carrier 30. Wafer carrier 30 is configured to receive wafer 10 shown within FIG. 1B. Additionally, CMP 24 includes a platen or polishing pad 32. Wafer 10 is mounted onto carrier 30 such that surface 24 of tungsten layer 22 faces and subsequently engages polishing pad 32.

CMP 24 includes a source (i.e., reservoir, not shown) containing a CMP slurry used in the polishing process for removing excess tungsten from the surface of dielectric layer 16. Typically, a CMP slurry is an acidic or basic aqueous solution that contains metal components such as $K_3Fe(CN)_6$, $Fe(NO_3)_3$, etc. The acidic or basic solution is chosen based upon the material to be polished in order to induce a chemical reaction. The chemical reaction changes the excess metal to a chemical compound that may be more readily removed by mechanical abrasion of the metal components (e.g., $K_3Fe(CN)_6$ or $Fe(NO_3)_3$) of the CMP slurry.

The CMP slurry is passed through a conduit (not shown) and onto polishing pad 32. A motor (not shown) rotates carrier 30 via spindle 32. Although not shown, polishing pad 32 is also coupled to a motor for rotating polishing pad 32. Typically, carrier 30 and polishing pad 32 are rotated at different rates but in the same direction as shown.

Carrier 30 rotates wafer 10 relative to polishing pad 32 while wafer 10 engages polishing pad 32 and while the CMP slurry is applied to polishing pad 32 or to the surface 24. This action removes excess tungsten from the surface of wafer 10, while leaving tungsten within vias 20. FIG. 1C shows formation of tungsten plugs 26 after CMP polishing to remove excess tungsten.

The polishing process described above to form tungsten plugs 26 may result in contamination of dielectric layer 16 with metal components (e.g., $K_3Fe(CN)_6$ or $Fe(NO_3)_3$) from the CMP slurry. These contaminants, if not removed, may affect IC performance characteristics and/or may cause IC device failure to occur at faster rates than usual. In the past, dielectric contaminants were removed using one of two processes. In the first dielectric contaminant removal process, the wafer, such as wafer 10 of FIG. 1C, is rotated at a very high speed while only an organic acid is applied to the surface 28 of the rotating wafer. It should be clear that nothing else (e.g., a polishing pad of a CMP) is applied to surface 28 during this application of the organic acid. In a second dielectric contaminant removal process, an oxide buffing solution is applied to surface 28. This second dielectric contaminant removal process uses a silicon based, oxide slurry buff to physically remove a predetermined amount (e.g., 500 Angstroms) of dielectric 16 that contains the contaminants. While this second dielectric contaminant removal process has been shown to effectively remove metal contamination from the dielectric 16, it does so at the expense of eroding the topography of the wafer, which in turn, reduces process margin and produces higher costs. FIG. 3 illustrates the results of silicon based, oxide slurry buffing a wafer such as wafer 10 shown in FIG. 1C. As can be seen within FIG. 3, the oxide buffing may remove a portion of tungsten plugs 26 and dielectric layer 16 in between tungsten plugs 26.

SUMMARY OF THE INVENTION

Reducing CMP wafer contamination by in-situ clean is disclosed herein. The invention can be employed in a method in which a conductive layer is formed on a surface of a wafer. After a portion of the conductive layer is removed, an acidic solution directly or indirectly to the wafer. Then the wafer is engaged with a polishing pad as the acidic solution is applied directly or indirectly to the wafer. In one embodiment, the portion of the conductive layer is removed by a CMP tool, and the wafer is engaged with the polishing pad before the semiconductor is removed from the CMP tool.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

The present invention provides an apparatus and method for reducing wafer contamination caused by, for example, CMP polishing. For purposes of explanation only, the present invention will be described with reference to removing metal (e.g. Fe) contamination, it being understood that the present invention should not be limited thereto. For example, the present invention could be used to remove contamination caused by CMP polishing to remove aluminum, aluminum derivatives, copper, copper derivatives, etc.

In one embodiment, the present invention provides a method for reducing contamination of a dielectric layer of a wafer. The invention may include the act of applying a dilute organic acid (e.g., EDTA [ethylene diamine tetra-acetic acid], oxalic acid, citric acid, picolinic acid, etc.) directly onto the surface of the wafer or indirectly onto the surface of the wafer via, for example, a CMP pad, while the wafer surface is buffed using, for example, the CMP pad. The present invention can be employed just after excess tungsten is removed using a CMP tool. In other words, the present invention can be employed before the wafer is removed from a CMP tool that was used to remove excess tungsten.

In one embodiment, the dilute organic acid is applied indirectly to the surface of the wafer via the CMP pad or directly to the wafer surface immediately after CMP polishing and while the wafer is still attached to the carrier of the CMP. While the organic acid is applied, the surface of the wafer is buff polished using, for example, the rotating pad of the CMP. During the buff polish, pressure is applied to the pad as it rotates against the wafer surface. Buff polishing the wafer surface while organic acid is applied thereto, removes containments including containments on the exposed dielectric surface. While under the applied pressure and rotation, the complexing and/or chelating efficiency of the organic acid ligands is enhanced, thereby further reducing metal contamination when compared to the prior art methods of removing containments described above. ICs manufactured using the disclosed method should have improved device reliability.

Figure 1A:
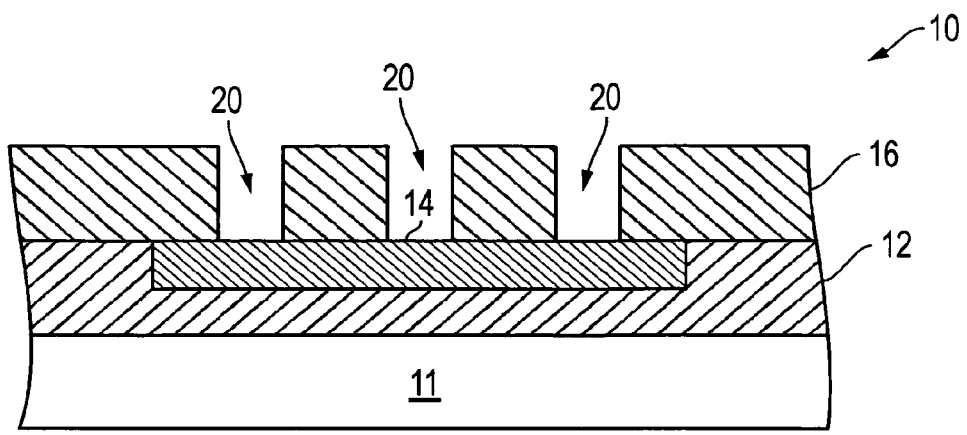
FIGS. 1A-1C are cross-sectional views of a portion of a partially fabricated integrated circuit.
Figure 1B:
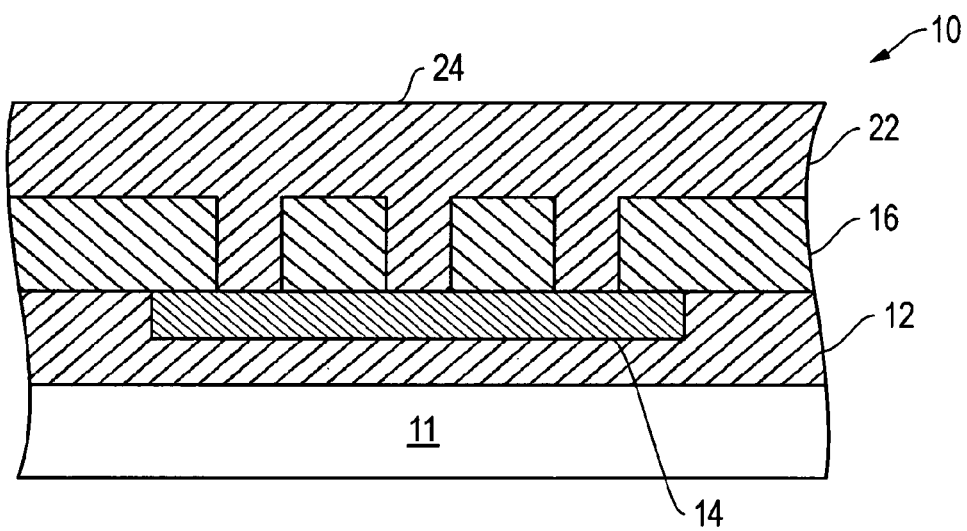
Figure 4:
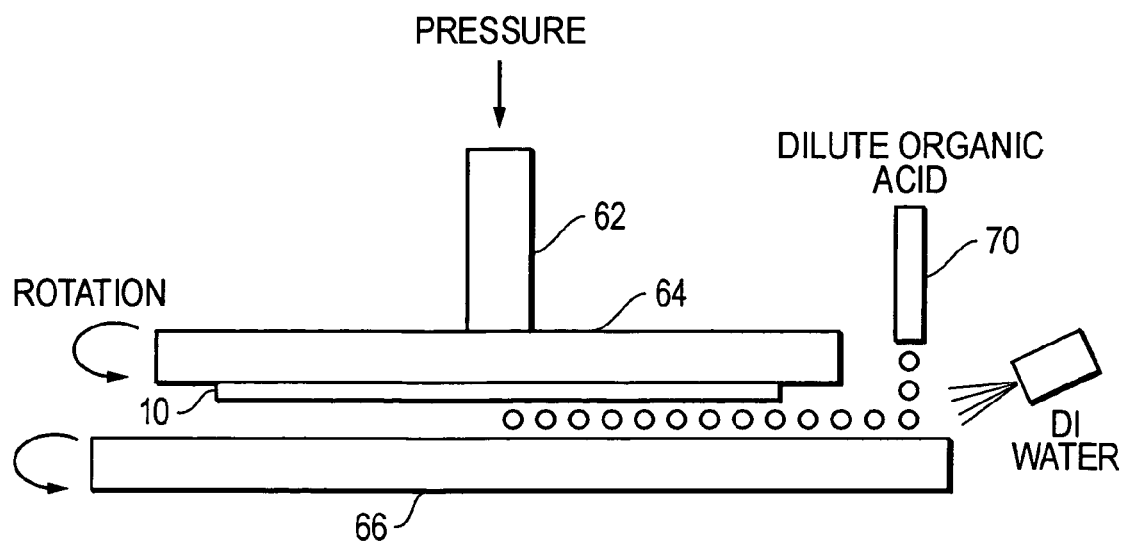
FIG. 4 is a block diagram showing relevant components of a CMP tool employing the present invention.

FIG. 4 illustrates relevant components of an exemplary CMP 60 employing or which can employ the present invention. CMP 60 shown in FIG. 4 includes a spindle 62 coupled to a wafer carrier 64. Wafer carrier 64 is configured to receive a wafer such as wafer 10 shown within FIG. 1B. Additionally, CMP 60 includes a platen or polishing pad 66. Wafer 10 is mounted on carrier 64 such that surface 64 of tungsten layer 22 faces and subsequently engages polishing pad 66.

Figure 1C:
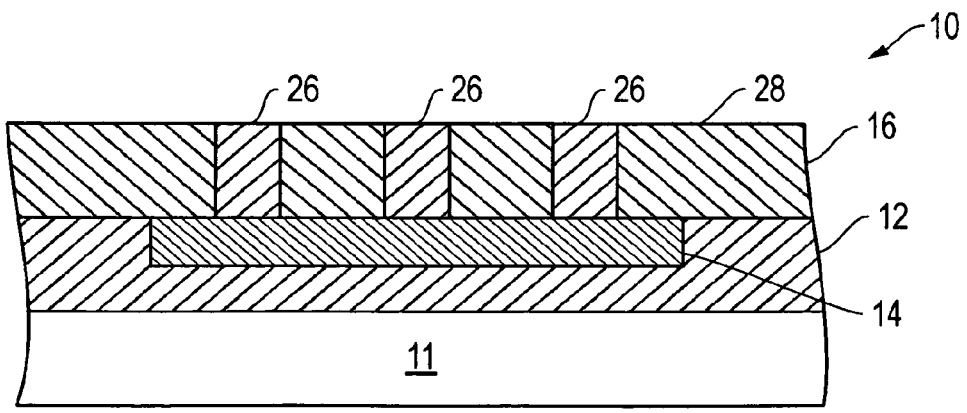
Figure 2:
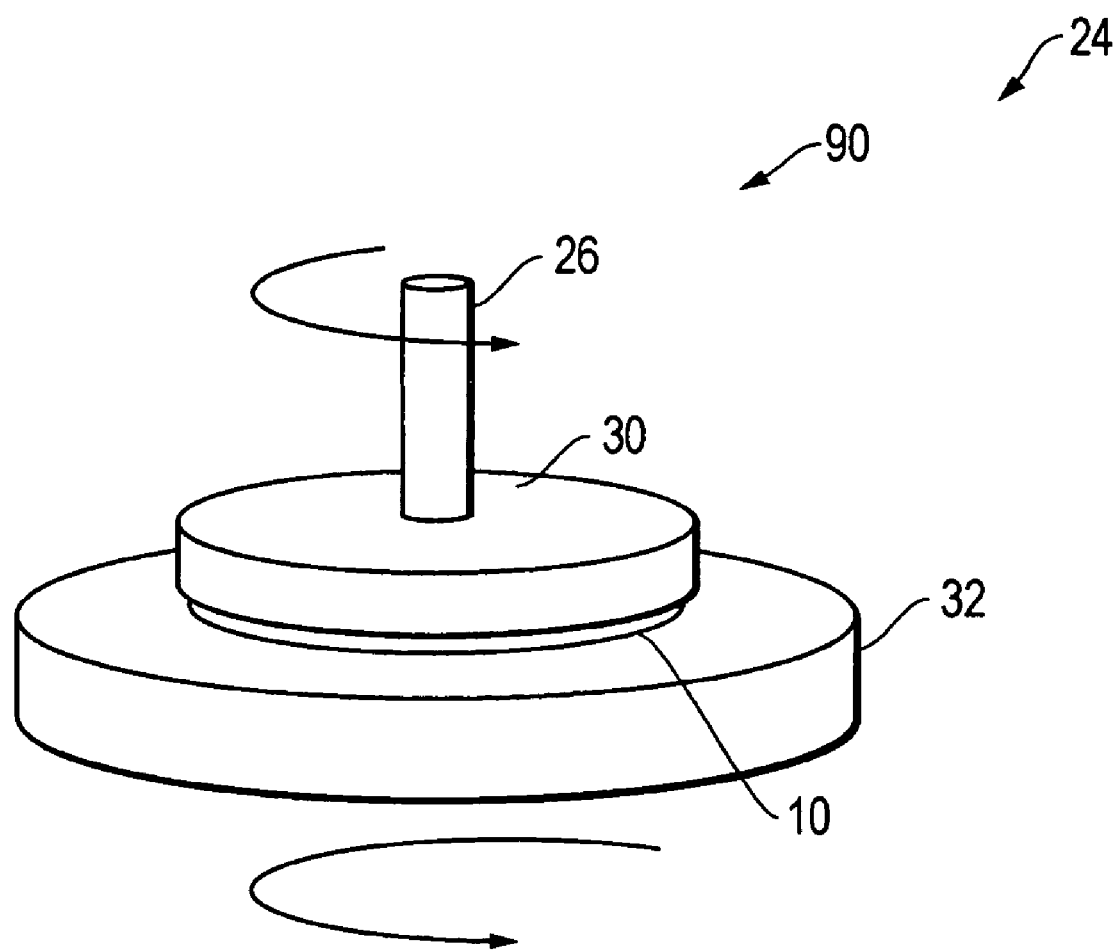
FIG. 2 is a block diagram showing relevant components of a conventional CMP tool.
Figure 3:
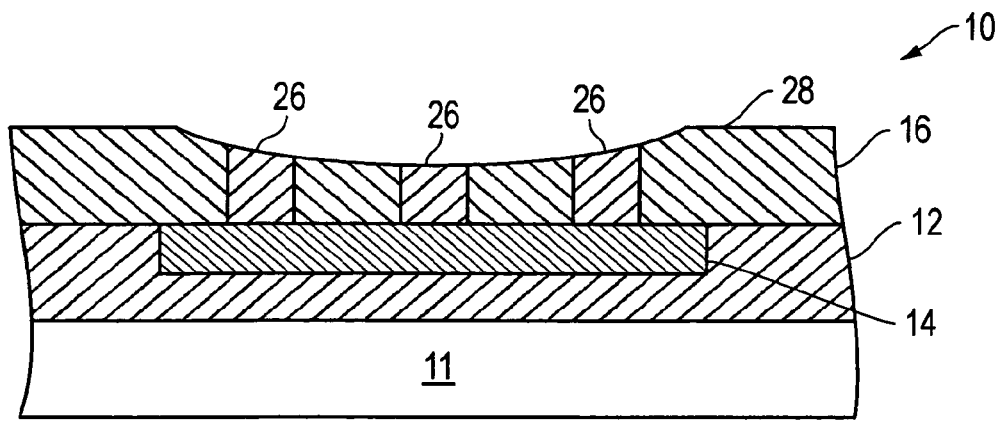
FIG. 3 illustrates the effects silicon based, oxide slurry buffing on a wafer.

CMP 60 includes a first source (not shown) containing a slurry for removing excess tungsten from the surface of dielectric layer 16 during a polishing process. In one embodiment, the slurries are acidic or basic and contain metal components. The slurry is passed through conduit (not shown) onto wafer 10 either directly or indirectly via polishing pad 66. Spindle 62 is coupled to and is rotated by a motor (not shown) which in turn rotates carrier 64. Although not shown, polishing pad 66 is also coupled to a motor for rotating polishing pad 66. Polishing pad 66 and wafer carrier 64 may be rotated at different rates but in the same direction. Carrier 64 rotates wafer while the polishing pad 66 engages wafer 10 and while the slurry containing the metal components is applied to wafer 10. This action removes excess tungsten from the surface of wafer 10. FIG. 1C shows wafer 10 after polishing by CMP 60 to remove excess tungsten.

Once excess tungsten has been removed from wafer 10, polishing pad 36 can be rinsed with deionized (DI) water to remove residual slurry thereon. In one embodiment, wafer 10 remains on the carrier 64 while the polishing pad 66 is rinsed with DI water. It is noted that wafer 10 may also be rinsed with DI water while the wafer is mounted to carrier 64.

CMP 60 includes a second reservoir (not shown) that includes a dilute organic acid complexant. In one embodiment, the pH of the dilute organic acid is less than five. The dilute organic acid is applied either directly or indirectly to a wafer 10. In one embodiment, the dilute organic acid is applied to the center of the polishing pad 66 while the polishing pad engages the surface of wafer 10, and while the polishing pad 66 is rotated relative to wafer 10. In FIG. 4 the dilute organic acid is applied to the surface of wafer 10 via conduit 70. DI water could also applied with the dilute organic acid. When a dilute organic acid and/or DI water is applied to the center of the polishing pad, the centrifugal force of the rotating polishing pad 66 distributes the dilute organic acid and/or DI water across the surface of wafer 10 while wafer 10 engages rotating polishing pad 66. This action is referred to herein as a buff polish. The buff polish can last for approximately 30 seconds, although in other embodiments, the buff polish may last for more or less than 30 seconds. In one embodiment, a pressure of approximately 1.0 psi is applied between wafer 10 and pad 66 as the wafer 10 is buff polished. In one embodiment, the relative rotation of the polishing pad to the wafer 10 is 45 RPM.

Figure 5:
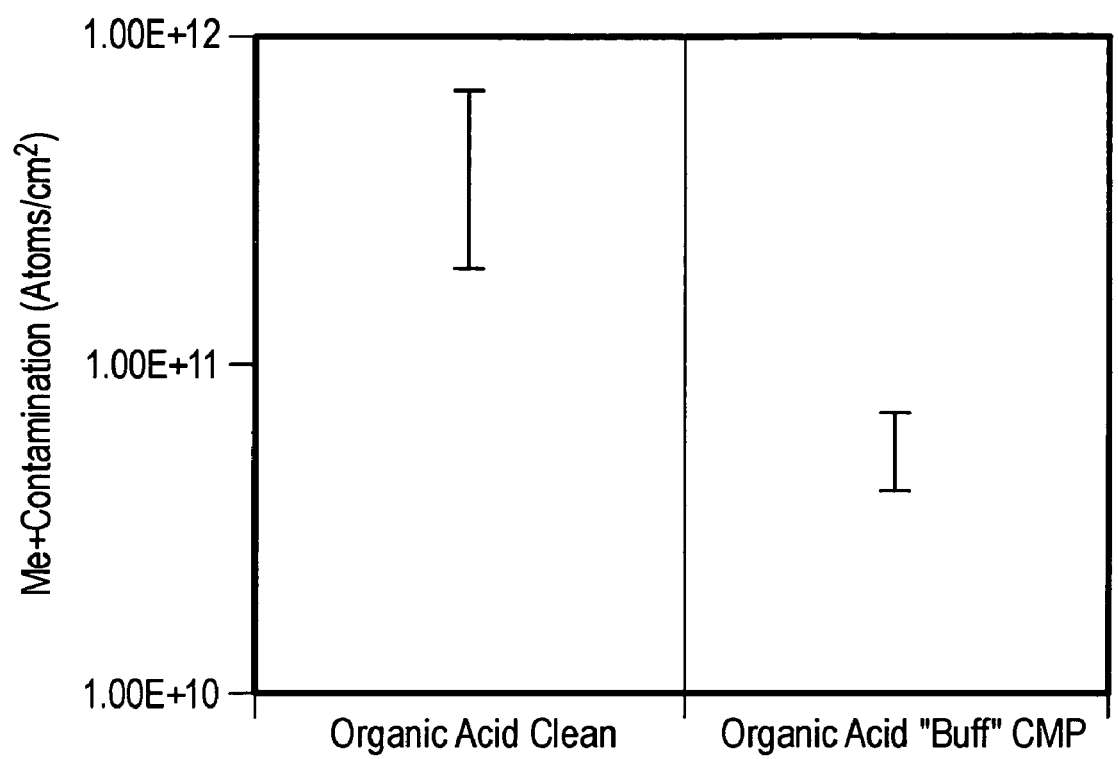
FIG. 5 is a graph of wafer contamination levels measured after using one embodiment of the present invention and the first dielectric contaminant removal process described above.

In this buff polish, the removal rate of the dielectric layer 16 is essentially zero. However, the buff polish removes contaminants introduced into the dielectric layer 16 during the excess tungsten removal polishing. FIG. 5 compares experimental results of using an organic acid buff polish to remove dielectric contamination in accordance with an embodiment of the invention described above to results using the conventional process in which only organic acid is applied to the surface of the wafer without engaging the wafer with the polishing pad. As can be seen within FIG. 5, the amount of contamination remaining in the wafer after the organic acid buff using the present invention is substantially lower when compared to the conventional method. Further, the organic acid buff using the present invention does not result in the type of topography degradation that is seen after the conventional oxide slurry based polishing described above Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
  forming a conductive layer on a surface of a semiconductor wafer;

mounting the semiconductor wafer on a wafer carrier of a chemical mechanical polisher (CMP) tool after formation of the conductive layer;

removing a portion of the conductive layer while the semiconductor wafer is mounted on the wafer carrier, wherein the act of removing the portion of the conductive layer comprises applying a slurry directly or indirectly to the semiconductor wafer;

rotating the semiconductor wafer after removal of the portion of the semiconductor layer, wherein the semiconductor wafer is rotated while it is mounted on the wafer carrier;

applying an acidic solution directly or indirectly to the semiconductor wafer while it is rotating and while the semiconductor wafer is mounted on the wafer carrier;

wherein the slurry and the acidic solution are contained in separate containers before they are applied to the semiconductor wafer;

engaging the semiconductor wafer with a polishing pad as the acidic solution is applied directly or indirectly to the semiconductor wafer, wherein the semiconductor wafer is engaged with the polishing pad while the semiconductor is mounted on the wafer carrier.

2. The method of claim 1 further comprising rinsing the semiconductor wafer with deionized water after removing the portion of the conductive layer and before applying the acidic solution.

3. The method of claim 1 further comprising applying deionized water directly or indirectly to the semiconductor wafer while it is rotating and while applying the acidic solution.

4. The method of claim 1 wherein the acidic solution comprises an organic acidic solution.

5. The method of claim 1 wherein the conductive layer is formed on a dielectric surface of the semiconductor wafer.

6. A method comprising:
forming a conductive layer on a surface of a semiconductor wafer;

removing a portion of the conductive layer, wherein the act of removing the portion of the conductive layer comprises applying a slurry directly or indirectly to the semiconductor wafer;

applying an acidic solution directly or indirectly to the semiconductor wafer after removing the portion of the conductive layer;

wherein the slurry and the acidic solution are contained in separate containers before the are a lied to the semiconductor wafer;

engaging the semiconductor wafer with a polishing pad as the acidic solution is applied directly or indirectly to the semiconductor wafer.

7. The method of claim 6 further comprising:
mounting the semiconductor wafer on a wafer carrier of a chemical mechanical polisher (CMP) tool after formation of the conductive layer, wherein the CMP tool comprises the polishing pad;

wherein the conductive layer is removed while the semiconductor wafer is mounted on the wafer carrier;

wherein the polishing pad engages the semiconductor wafer while the semiconductor wafer is mounted on the wafer carrier.

8. The method of claim 7 further comprising:
rotating the semiconductor wafer relative to the polishing pad while the polishing pad engages the semiconductor wafer;

wherein the acidic solution is applied directly or indirectly to the semiconductor wafer while the polishing pad engages the semiconductor wafer and while the semiconductor wafer is rotating.

9. The method of claim 6 wherein the semiconductor wafer is engaged with the polishing pad of a CMP while the acidic solution is applied directly or indirectly to the semiconductor wafer.

10. The method of claim 6 further comprising rinsing the semiconductor wafer with water after removing the portion of the conductive layer and before applying the acidic solution.

11. The method of claim 10 further comprising rinsing the polishing pad with water after removing the portion of the conductive layer and before applying the acidic solution.

12. The method of claim 6 further comprising applying water directly or indirectly to the semiconductor wafer while the polishing pad engages the semiconductor wafer and while applying the acidic solution to the semiconductor wafer.

13. The method of claim 6 wherein the acidic solution comprises an organic acidic solution.

* * * * *